(12) United States Patent
Chai et al.

(10) Patent No.: US 12,430,486 B1
(45) Date of Patent: Sep. 30, 2025

(54) COMBINED GLOBAL AND LOCAL PROCESS VARIATION MODELING

(71) Applicant: Synopsys, Inc., Mountain View, CA (US)

(72) Inventors: Wenwen Chai, Sunnyvale, CA (US); Li Ding, San Jose, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 577 days.

(21) Appl. No.: 18/060,390

(22) Filed: Nov. 30, 2022

(51) Int. Cl.
  *G06F 30/367* (2020.01)
  *G06F 30/20* (2020.01)
  *G06F 30/3308* (2020.01)
  *G06F 30/3323* (2020.01)
  *G06F 30/398* (2020.01)

(52) U.S. Cl.
  CPC ........ *G06F 30/367* (2020.01); *G06F 30/3323* (2020.01); *G06F 30/20* (2020.01); *G06F 30/3308* (2020.01); *G06F 30/398* (2020.01)

(58) Field of Classification Search
  CPC .... G06F 30/367; G06F 30/20; G06F 30/3308; G06F 30/3323; G06F 30/398
  USPC ............................ 716/107, 111, 136; 703/14
  See application file for complete search history.

(56) References Cited

U.S. PATENT DOCUMENTS

| | | | | |
|---|---|---|---|---|
| 6,978,229 B1 * | 12/2005 | Saxena | ................. | G06F 30/367 700/32 |
| 8,074,189 B2 * | 12/2011 | McConaghy | ......... | G06F 30/367 716/110 |
| 8,296,701 B2 * | 10/2012 | Jain | ....................... | G06F 30/367 716/136 |
| 8,370,786 B1 * | 2/2013 | Burstein | ................. | G06F 30/39 716/132 |
| 8,380,478 B2 * | 2/2013 | Houston | ............. | G06F 30/3323 700/51 |
| 9,268,885 B1 * | 2/2016 | Wang | ..................... | G06F 30/367 |
| 9,361,423 B2 * | 6/2016 | Su | .......................... | G06F 30/398 |
| 9,977,845 B2 * | 5/2018 | Kim | ..................... | G06F 30/3312 |
| 10,042,970 B2 * | 8/2018 | Pandey | .................. | G06F 30/394 |
| 10,120,969 B1 * | 11/2018 | Sinclair | ................... | G06F 30/34 |
| 10,169,507 B2 * | 1/2019 | Kuo | ....................... | G06F 30/33 |

(Continued)

FOREIGN PATENT DOCUMENTS

| | | | | |
|---|---|---|---|---|
| CA | 2736445 A1 * | 10/2012 | ......... | G06F 30/3323 |
| CN | 105447222 A * | 3/2016 | | |
| CN | 107038271 A * | 8/2017 | ......... | G06F 30/3312 |

OTHER PUBLICATIONS

Agarwal et al., "Path-Based Statistical Timing Analysis Considering Inter- and Intra-Die Correlations", 2002 ACM, pp. 1-6. (Year: 2002).*

(Continued)

*Primary Examiner* — Phallaka Kik
(74) *Attorney, Agent, or Firm* — Laxman Sahasrabuddhe; Park, Vaughan, Fleming & Dowler LLP

(57) ABSTRACT

A set of global parameters may be modeled using a set of equivalent parameters, where the set of global parameters represents global process variation in a circuit. A global distribution for a metric in the circuit may be determined by performing Monte-Carlo (MC) analysis using the set of equivalent parameters. Combined local and global variations for the metric may be calculated based on the global distribution for the metric and a local distribution for the metric.

20 Claims, 6 Drawing Sheets

Model a set of global parameters using a set of equivalent parameters, where the set of global parameters represents global process variation in a circuit — 102

Determine a global distribution for a metric in the circuit by performing MC analysis using the set of equivalent parameters — 104

Calculate combined local and global variations for the metric based on the global distribution for the metric and a local distribution for the metric — 106

(56) References Cited

U.S. PATENT DOCUMENTS

| | | | | |
|---|---|---|---|---|
| 2002/0144216 A1* | 10/2002 | Leonard | ............... | G06F 30/33 |
| | | | | 716/136 |
| 2004/0044979 A1* | 3/2004 | Aji | ............... | G06F 30/394 |
| | | | | 716/135 |
| 2009/0199145 A1* | 8/2009 | Scheffer | ............... | G06F 30/33 |
| | | | | 716/113 |
| 2012/0259446 A1* | 10/2012 | Mcconaghy | ............... | G06F 30/33 |
| | | | | 716/132 |
| 2013/0024465 A1* | 1/2013 | Schiff | ............... | G06F 16/24578 |
| | | | | 707/E17.005 |
| 2015/0339414 A1* | 11/2015 | Kuo | ............... | G06F 17/18 |
| | | | | 716/103 |
| 2016/0300004 A1* | 10/2016 | Barker | ............... | G06F 30/367 |
| 2018/0004880 A1* | 1/2018 | Sattiraju | ............... | G06F 30/367 |
| 2020/0167518 A1* | 5/2020 | Chen | ............... | G06F 30/394 |
| 2022/0050947 A1* | 2/2022 | Chai | ............... | G06F 30/3315 |
| 2023/0195984 A1* | 6/2023 | Mandal | ............... | G06F 30/398 |
| | | | | 716/113 |
| 2023/0222277 A1* | 7/2023 | Chen | ............... | G06F 30/3315 |
| | | | | 716/106 |
| 2023/0385512 A1* | 11/2023 | Chen | ............... | G06F 30/392 |
| 2024/0232486 A1* | 7/2024 | Alawieh | ............... | G06F 30/327 |

OTHER PUBLICATIONS

Sani Nassif, "Delay Variability: Sources, Impacts and Trends", in IEEE Solid-State Circuits Conference, pp. 368-369, 2000.

Sani Nassif, "Modeling and Analysis of Manufacturing Variations", in IEEE Custom Integrated Circuits Conference, pp. 223-228, 2001.

Aseem Agarwal et al., "Path-Based Statistical Timing Analysis Considering Inter-and Intra-Die Correlations", In ACM International workshop, pp. 16-21, 2002.

Vineeth Veetil et al., "Fast Statistical Static Timing Analysis Using Smart Monte Carlo Techniques", IEEE Trans on CAD., pp. 852-865, 2011.

* cited by examiner

COMBINED GLOBAL AND LOCAL PROCESS VARIATION MODELING

TECHNICAL FIELD

The present disclosure generally relates to electronic design automation (EDA) systems. More specifically, the present disclosure relates to combined global and local process variation modeling.

BACKGROUND

Advances in process technology and an increasing demand for computing and storage have fueled an increase in the size and complexity of integrated circuit (IC) designs. Static timing analysis (STA) is an important step in an IC design flow, in which timing constraints of an IC design may be checked to ensure that the IC design is expected to operate as desired when the IC design is manufactured.

SUMMARY

A set of global parameters may be modeled using a set of equivalent parameters, where the set of global parameters represents global process variation in a circuit. A global distribution for a metric in the circuit may be determined by performing Monte-Carlo (MC) analysis using the set of equivalent parameters. Combined local and global variations for the metric may be calculated based on the global distribution for the metric and a local distribution for the metric.

In some embodiments described herein, modeling the set of global parameters using the set of equivalent parameters may include: determining a set of representative circuits, determining a set of global process corners corresponding to the metric in the set of representative circuits by performing MC analysis using the set of global parameters, where the metric has a first set of values at the set of global process corners, and determining a set of value changes for the set of equivalent parameters which generate a second set of values of the metric at the set of global process corners which are substantially equal to the first set of values of the metric.

In some embodiments described herein, the set of equivalent parameters may include one parameter per device type and two parameters per interconnect layer. For example, the one parameter per device type may be a threshold voltage, and the two parameters per interconnect layer may be a resistance per unit length and a capacitance per unit length.

In some embodiments described herein, calculating the combined local and global variations for the metric may include calculating a linear combination of the global distribution for the metric and the local distribution for the metric. In some embodiments described herein, calculating the combined local and global variations for the metric may include calculating a root sum squared combination of the global distribution for the metric and the local distribution for the metric.

In some embodiments described herein, calculating the combined local and global variations for the metric may include determining local distribution amounts for the metric at a set of process corners by scaling a nominal local distribution amount for the metric based on global distribution amounts for the metric at the set of process corners.

BRIEF DESCRIPTION OF THE FIGURES

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
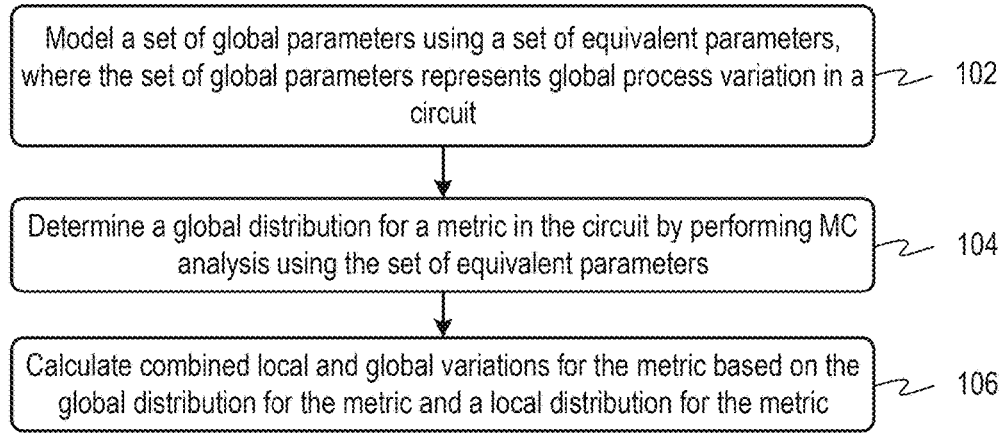
FIG. 1 illustrates a process for combining global and local process variation in accordance with some embodiments described herein.

Aspects of the present disclosure relate to combined global and local process variation modeling. An IC chip may be manufactured by using a semiconductor manufacturing process. Each step in the semiconductor manufacturing process may use complex physical and/or chemical processes. The term "process variation" may refer to one or more random and/or systematic variations that occur during semiconductor manufacturing, and which cause variations in the characteristics and/or the behavior of circuit elements in the manufactured circuit. The term "process corner" or "corner" may refer to a value of an electrical property of a circuit element that corresponds to a process variation. For example, a given process corner may correspond to a particular transistor threshold voltage value.

With the continuous shrinking of technology nodes, IC designs are becoming more sensitive to variations such as threshold voltage variations, doping density variations, and geometry variations. The term "technology node" may refer to the smallest feature dimension that can be reliably manufactured by a semiconductor manufacturing process. For example, the term "5 nm node" may refer to a semiconductor manufacturing process that can reliably manufacture 5 nm features. The term "advanced technology node" may refer to the smallest technology nodes that are currently being used.

Process variations can generally be categorized as global process variations and local process variations. The term "global" may refer to the entire IC design and the term "local" may refer to a neighborhood around a circuit element. In STA, local process variations may be modeled using POCV (Parametric On-Chip Variation) within a single STA run, and global process variations may be modeled using multiple STA runs at different corners, e.g., fast-fast (FF), typical-typical (TT), and slow-slow (SS) corners. A TT corner may correspond to semiconductor manufacturing conditions that cause n-type metal-oxide-semiconductor (NMOS) transistors and p-type metal-oxide-semiconductor (PMOS) transistors to switch at a typical speed. The first "T" in TT corresponds to the switching speed of NMOS transistors and the second "T" in TT corresponds to the switching speed of PMOS transistors. Likewise, the FF corner corresponds to faster-than-typical switching speeds and the SS corner corresponds to slower-than-typical switching speeds.

Some approaches attempt to model combined global and local process variations within a single STA run. However, these approaches take significantly longer to run, and use significantly more memory.

Some embodiments described herein feature an accurate and efficient system to model combined global and local process variations. Specifically, some embodiments described herein may model global process variation using a set of equivalent parameter value changes. The set of equivalent parameter value changes may be used in an MC analysis to generate an accurate global process distribution. The global process distribution generated using the MC analysis may be combined with a local process distribution. The combined global and local process distribution may then be used during STA.

Technical advantages of embodiments described herein include, but are not limited to, (1) reducing the amount of processor time and memory used for accurately calculating combined global and local process variations during STA, and (2) decreasing the overall time used for designing a circuit by increasing the accuracy and performance of the combined global and local process variation computation in STA.

FIG. 1 illustrates a process for combining global and local process variation in accordance with some embodiments described herein.

A set of global parameters may be modeled using a set of equivalent parameters, where the set of global parameters represents global process variation in a circuit (at 102). Specifically, the set of equivalent parameters may be substantially smaller than the set of parameters that are typically used for modeling global process variation. Typically, tens to hundreds of parameters may be used by some techniques to model global process variation. However, the set of equivalent parameters may be substantially less than tens to hundreds of parameters. Specifically, the set of equivalent parameters may be a subset of the set of global parameters. In some embodiments described herein, the set of equivalent parameters may include dominant parameters per device type and per interconnect layer. For example, one parameter per device type may be selected, such as a threshold voltage, and two parameters per interconnect layer may be selected, such as a resistance per unit length and a capacitance per unit length, or a resistance scaling factor and a capacitance scaling factor. A resistance scaling factor per interconnect layer may be a value which is used to scale resistance values in an interconnect layer. For example, if the resistance scaling factor is 1.2 for an interconnect layer, then the resistance values in this interconnect layer may be scaled by multiplying the resistance values with the resistance scaling factor of 1.2. Likewise, a capacitance scaling factor per interconnect layer may be a value which is used to scale capacitance values in an interconnect layer. For example, if the capacitance scaling factor is 0.9 for an interconnect layer, then the capacitance values in this interconnect layer may be scaled by multiplying the capacitance values with the capacitance scaling factor of 0.9.

A global distribution for a metric in the circuit may be determined by performing MC analysis using the set of equivalent parameters (at 104). The MC analysis may be substantially faster (i.e., may take substantially less processor computations) than MC analysis that uses tens or hundreds of parameters for modeling global process variation. MC analysis may refer to a probabilistic simulation performed on a computer. An MC analysis typically performs many iterations. In each iteration, a set of values may be determined for a set of random variables. The set of values may be used to perform a computation, and the results of the computation may be stored as one or more data points corresponding to the MC iteration. Once the MC analysis completes, the set of data points generated by the MC analysis may be used in further computations. It is impractical to perform MC analysis manually. MC analysis is typically performed by a set of instructions executing on a processor.

Combined local and global process variation for the metric may be calculated based on the global distribution for the metric and a local distribution for the metric (at 106). In embodiments where FF, TT, and SS libraries are available for the voltage and temperature corners, an interpolation-based technique may be used to calculate combined local and global process variation.

Specifically, the combined local and global variations for the metric may be calculated by using a linear combination of the global distribution for the metric and the local distribution for the metric. Alternatively, the combined local and global variations for the metric may be calculated by using a root sum squared combination of the global distribution for the metric and the local distribution for the metric.

In embodiments where a TT library is available, but FF and SS libraries are not available, for the voltage and temperature corners, a scaling or prediction-based technique may be used to calculate combined local and global process variation. Specifically, local distribution amounts for the metric at a set of process corners may be determined by scaling a nominal local distribution amount for the metric based on global distribution amounts for the metric at the set of process corners. The local distribution amounts that were determined by scaling may then be used to determine the combined local and global variations for the metric.

The combined local and global process variation determined by the process illustrated in FIG. 1 is efficient (i.e., it uses fewer processor and memory resources) and accurate (i.e., the combined local and global process variation values computed by the process are substantially equal to the combined local and global process variation values computed by an approach that uses tens or hundreds of parameters to model global process variation). Specifically, the combined local and global process variation values computed by the process shown in FIG. 1 is excellently correlated with corresponding values determined by using a device-level circuit simulation program, such as Simulation Program with Integrated Circuit Emphasis (SPICE) which may be implemented using a set of instructions which execute on a processor. Additionally, the process illustrated in FIG. 1 may be used with different types of global variations such as global variations that affect the characteristics of circuit devices and interconnects.

Some techniques model global variation by using a large number of global parameters, e.g., tens to hundreds of parameters depending on the desired accuracy level. For example, some techniques may use a set of global parameters as shown in the table below.

| Groups | Device global parameters |
| --- | --- |
| Group-1 | Vth, Idsat, cap, tfin, hfin, width, deltaL |
| Group-2 | 50+ other FET device parameters |
| Group-3 | 30+ non-FET device parameters |
| Group-4 | Additional device parameters |

In the above table, the global parameters for an IC design a have been divided into a set of groups, e.g., Group-1 through Group-4. Group-1 includes seven field effect transistor (FET) parameters (e.g., Vth may be the threshold voltage, Idsat may be the saturation current, tfin may be the fin thickness, hfin may be the fin height, width may be the channel width, and deltaL may be the channel length), Group-2 includes more than 50 FET device parameters, Group-3 includes more than 30 non-FET device parameters, and Group-4 includes additional device parameters. Approaches that model all global parameters (e.g., the global parameters shown in the above table) may use a large amount of processor time and memory. Embodiments described herein can provide the same accuracy as approaches that use tens or hundreds of global parameters but use substantially less processor and memory resources.

Figure 2:
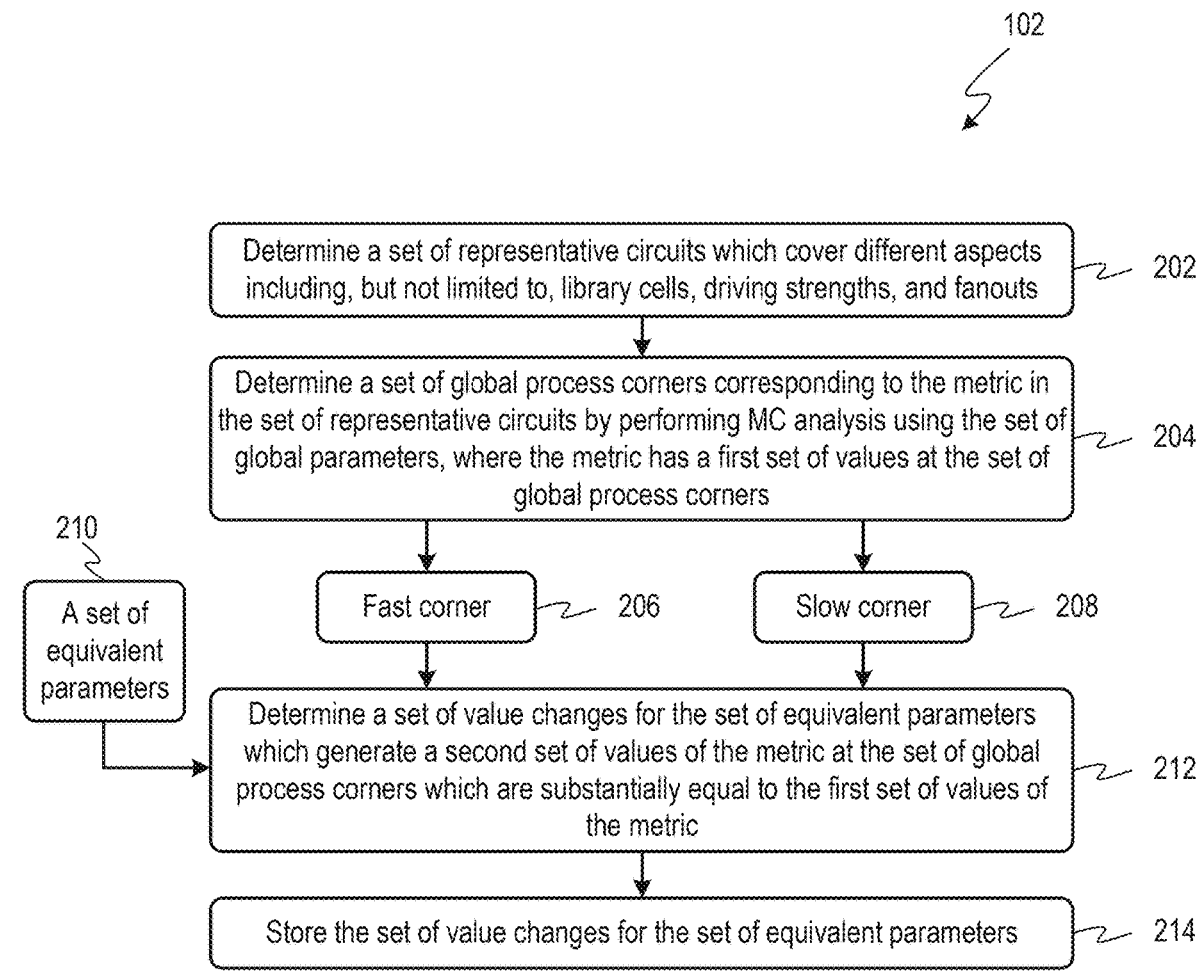
FIG. 2 illustrates a process for modeling global parameters using a set of equivalent parameters in accordance with some embodiments described herein.

FIG. 2 illustrates a process for modeling global parameters using a set of equivalent parameters in accordance with some embodiments described herein. The process illustrated in FIG. 2 may correspond to step 102 in FIG. 1.

A set of representative circuits may be determined which cover different aspects including, but not limited to, library cells, driving strengths, and fanouts (at 202).

A set of global process corners corresponding to the metric in the set of representative circuits may be determined by performing MC analysis using the set of global parameters, where the metric has a first set of values at the set of global process corners (at 204). Specifically, the set of global parameters used in step 204 may include tens or hundreds of global parameters (e.g., the parameters shown in the above table), and the MC analysis may use a device-level circuit simulation program, such as SPICE, to compute the desired metric. A desired metric, e.g., gate delay or arrival time, may be measured during the MC analysis. An arrival time may correspond to the total delay of a timing path, i.e., from the timing start-point to the timing end-point. A required time may correspond to the maximum allowed delay along the time path for correct operation of the IC design. A timing slack for a timing path may be equal to a difference between the required time and the arrival time for the timing path (e.g., the timing slack may be equal to the required time minus the arrival time).

The parameter values that generate extremum values for the desired metric may be identified as the global process corners. For example, a fast corner 206 and a slow corner 208 may be identified using the MC-based analysis. The fast corner 206 may correspond to a minimum value of the desired metric (e.g., minimum arrival time) across all corners, and the slow corner 208 may correspond to a maximum value of the desired metric (e.g., maximum arrival time) across all corners. The MC analysis may be performed for each circuit in the set of representative circuits, and global process corners may be determined for each circuit in the set of representative circuits.

A set of equivalent parameters 210 may be specified, where the set of equivalent parameters 210 may be a subset of the set of global parameters that were used in the MC analysis. For example, the set of equivalent parameters 210 may include one or a few parameters per device type and one or a few parameters per interconnect layer. In some embodiments, the set of equivalent parameters may include one parameter (which may be the threshold voltage) per device type and two parameters (which may be the resistance per unit length and the capacitance per unit length) per interconnect layer. In general, the set of equivalent parameters 210 may be represented by a vector $\vec{P}$, $$\vec{P} = \{P_1, P_2, \ldots, P_n\},$$

where, $P_1, P_2, \ldots, P_n$, are the equivalent parameters.

A set of value changes for the set of equivalent parameters may be determined which generate a second set of values of the metric at the set of global process corners which are substantially equal to the first set of values of the metric (at 212). The vector $\Delta \vec{P}$ may represent the change to the set of equivalent parameters with respect to the values at the typical corner. In other words, the vector $\Delta \vec{P}$ may be a zero vector at the typical corner. Let $\Delta \vec{P}_{fast}$ and $\Delta \vec{P}_{slow}$ represent the changes (with respect to the values at the typical corner) to the vector $\vec{P}$ at the fast corner and the slow corner, respectively. In other words, let $$\Delta \vec{P}_{fast} = \{\Delta P_1, \Delta P_2, \ldots \Delta P_n\}_{fast}, \text{ and}$$

$$\Delta \vec{P}_{slow} = \{\Delta P_1, \Delta P_2, \ldots \Delta P_n\}_{slow}.$$

In step 212, $\Delta \vec{P}_{fast}$ and $\Delta \vec{P}_{slow}$ may be determined so that the collective impact of $\Delta \vec{P}_{fast}$ and $\Delta \vec{P}_{slow}$ to the desired metric values (e.g., arrival times) matches the desired metric values that were determined using the MC analysis. Thus, the changes to the set of equivalent parameters ($\Delta \vec{P}_{fast}$ and $\Delta \vec{P}_{slow}$) may be used instead of using tens or hundreds of global parameters to accurately compute the desired metric at the fast corner and the slow corner.

Specifically, in step 212, the set of equivalent parameters may be calibrated. For example, let the value of a global parameter $G_1$ be equal to 0.7 and 0.9 at the fast corner and slow corner, respectively. Further, let $G_1$ be selected as one of the equivalent parameters, e.g., $P_1$. Global parameter $G_1$ may be calibrated to obtain equivalent parameter P1 so that equivalent parameter P1 has values 0.6 and 1.0 at the fast corner and slow corner, respectively, and these values of the equivalent parameter P1 results in desired metric values that are substantially equal to the desired metric values that were determined using the MC analysis. The set of value changes for the set of equivalent parameters may be stored (at 214). For example, the set of value changes for the set of equivalent parameters may be stored in a data structure.

Figure 3A:
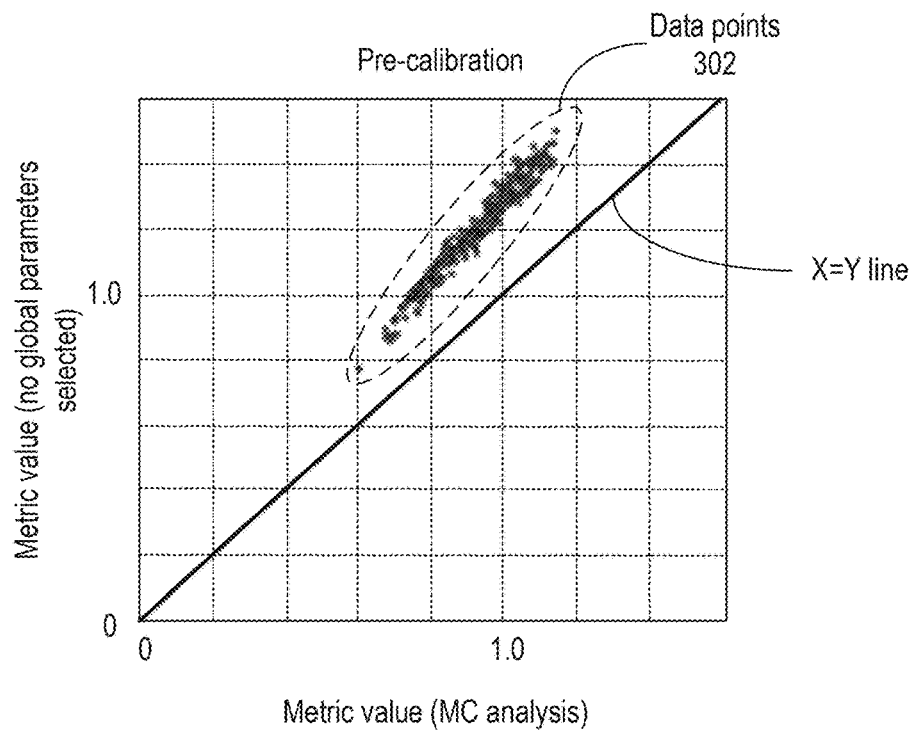
FIGS. 3A-3B illustrate desired metric values before and after calibrating global parameters in accordance with some embodiments described herein.
Figure 3B:
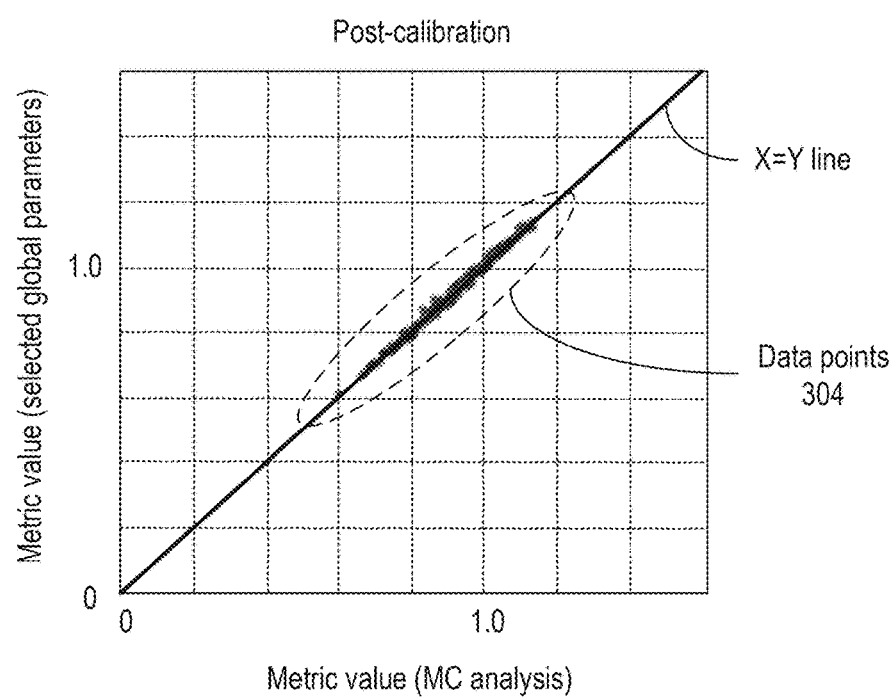

FIGS. 3A-3B illustrate desired metric values before and after calibrating global parameters in accordance with some embodiments described herein.

A metric may be a function of a set of global parameters. A subset of the global parameters may be selected as the equivalent parameters. The X-axis in FIGS. 3A-3B corresponds to the values of the metric as computed by the MC analysis that uses the entire set of global parameters. The Y-axis in FIGS. 3A-3B corresponds to the values of the metric when computed using global parameters. Specifically, the Y-axis in FIG. 3A corresponds to no global parameters selected, and the Y-axis in FIG. 3B corresponds to the selected global parameters. The X=Y line represents a line where the metric computed using the selected global parameters equals the metric computed using the MC analysis. Each data point may correspond to a metric value computed for an IC design in the set of representative IC designs. FIG. 3A corresponds to the situation before calibration, in which the data points 302 are not along the X=Y line. FIG. 3B corresponds to the situation after calibration, in which the data points 304 are substantially along the X=Y line. Thus, FIGS. 3A-3B illustrate that excellent accuracy can be achieved when a small set of equivalent global parameters are calibrated.

The set of equivalent parameters may be used to accurately calculate the desired metric value at specific corners. However, the set of equivalent parameters does not provide us with information about the distribution of the global process variation.

Figure 4A:
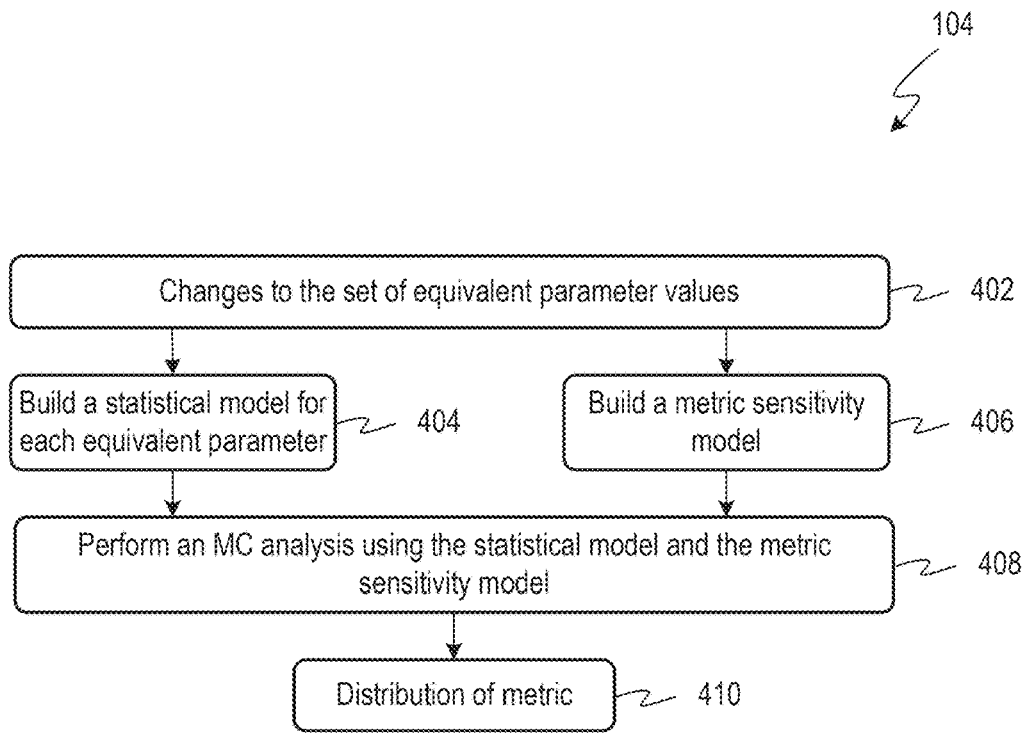
FIG. 4A illustrates a process for modeling the distribution of global process variation in accordance with some embodiments described herein.

FIG. 4A illustrates a process for modeling the distribution of global process variation in accordance with some embodiments described herein. The process illustrated in FIG. 4A may correspond to step 104 in FIG. 1.

The changes to the set of equivalent parameter values 402 may be used to build a statistical model for each equivalent parameter (at 404). The statistical model may be selected from set of distribution functions, which may include, but are not limited to, a normal distribution function and a lognormal distribution function. Specifically, the changes to the set of equivalent parameter values 402 may be used to determine the parameters of the distribution function.

Figure 4B:
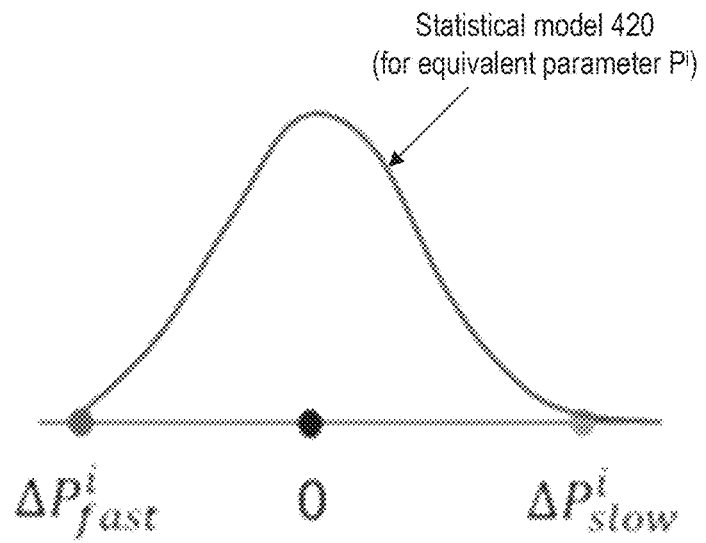
FIG. 4B illustrates a statistical model for an equivalent parameter in accordance with some embodiments described herein.

FIG. 4B illustrates a statistical model for an equivalent parameter in accordance with some embodiments described herein.

A distribution function (e.g., lognormal distribution function) for equivalent parameter $P^i$ may be selected and parameterized using the changes to equivalent parameter $P^i$ at the fast and slow corners. For example, the statistical model 420 for equivalent parameter $P^i$ may be obtained by selecting p and a values for a lognormal distribution so that statistical model 420 generates random values between $\Delta P_{fast}^i$ and $\Delta P_{slow}^i$ in accordance with a lognormal probability distribution.

Referring to FIG. 4A, a metric sensitivity model may be built using the changes to the set of equivalent parameter values 402 (at 406). The metric sensitivity model may determine a change in the metric value based on a change in a given equivalent parameter. For example, suppose the metric is timing slack, then the metric sensitivity model may be determined as follows. Timing impact of each equivalent parameter $P^i$ may be computed by perturbing the equivalent parameter value by the corner values, e.g., $\{\Delta \vec{P}_{fast}^i, \Delta P_{slow}^i\}$. Path-based timing analysis may be performed for each corner (e.g., fast and slow corners) to obtain the change in the timing slack values, e.g., $\{\Delta S_{fast}^i, \Delta S_{slow}^i\}$. A response surface model may then be determined based on the perturbations to the equivalent parameters (e.g., $\Delta P$ values) and the corresponding changes to the timing slack values (e.g., $\Delta S$ values). Specifically, the response surface model may be represented as:

$$\Delta s_i = a_i \Delta p_i^2 + b_i \Delta p_i,$$

where, $\Delta s_i$ is the change in the metric (e.g., timing slack), $\Delta p_i$ is the change in the equivalent parameter value, and where $a_i$ and $b_i$ are coefficients that are fitted based on the perturbations to the equivalent parameters (e.g., $\Delta P$ values) and the corresponding changes to the timing slack values (e.g., $\Delta S$ values).

An MC analysis may be performed using the statistical model and the metric sensitivity model (at 408) to obtain a distribution of the metric 410. Specifically, in each iteration of the MC analysis, equivalent parameter values may be randomly selected using the statistical models and a metric change value may be computed by using the metric sensitivity model. The collection of metric change values may then be used to determine the distribution of metric 410. For example, the collection of metric change values may be used to fit a distribution function to obtain the distribution of metric 410.

An interpolation-based technique may be used to combine local and global variation when fast, typical, and slow, i.e., {FF, TT, SS}, libraries are available for the same voltage and temperature. The interpolation-based technique may be performed in step 106 of FIG. 1. Specifically, a shape of the combined variation may be determined by interpolation using a first point, second point, and a third point selected from the fast library, the typical library, and the slow library, respectively.

For example, the first point may be an early 3-sigma point from the FF library, the second point may be the nominal point from the TT library, and the third point may be a late 3-sigma point from the SS library. In other words, the combined variation may be obtained by linearly combining local variation (which may be obtained from the {FF, TT, SS}libraries) and global variation (which may be obtained from step 410).

The local variations from the {FF, TT, SS}libraries may be used to project a total variation with a mean $\mu_{full}$ and standard deviation $\sigma_{full}$. A standard deviation for the global distribution $\sigma_{global}$ may be computed may be computed as follows: $\sigma_{global} = \sigma_{full} - \sigma_{TT,local}$. An updated or new standard deviation may be computed as follows:

$$\sigma_{full}^{new} = \sqrt{\sigma_{global}^2 + \sigma_{TT,local}^2}.$$

The combined local and global distribution may then be determined based on $(\mu_{full}, \sigma_{full}^{new})$.

Specifically, in some embodiments described herein, the combined distribution may be a normal distribution with parameters $(\mu_{full}, \sigma_{full}^{new})$. In some embodiments, the combined variation may be a lognormal distribution with mean $\mu_{ln}$ and standard deviation $\sigma_{ln}$, where $$\mu_{ln} = \log\left(\frac{\mu_{full}^2}{\sqrt{(\sigma_{full}^{new})^2 + \mu_{full}^2}}\right), \text{ and}$$

$$\sigma_{ln} = \log\left(\left(\frac{\sigma_{full}^{new}}{\mu_{full}}\right)^2 + 1\right).$$

Figure 5:
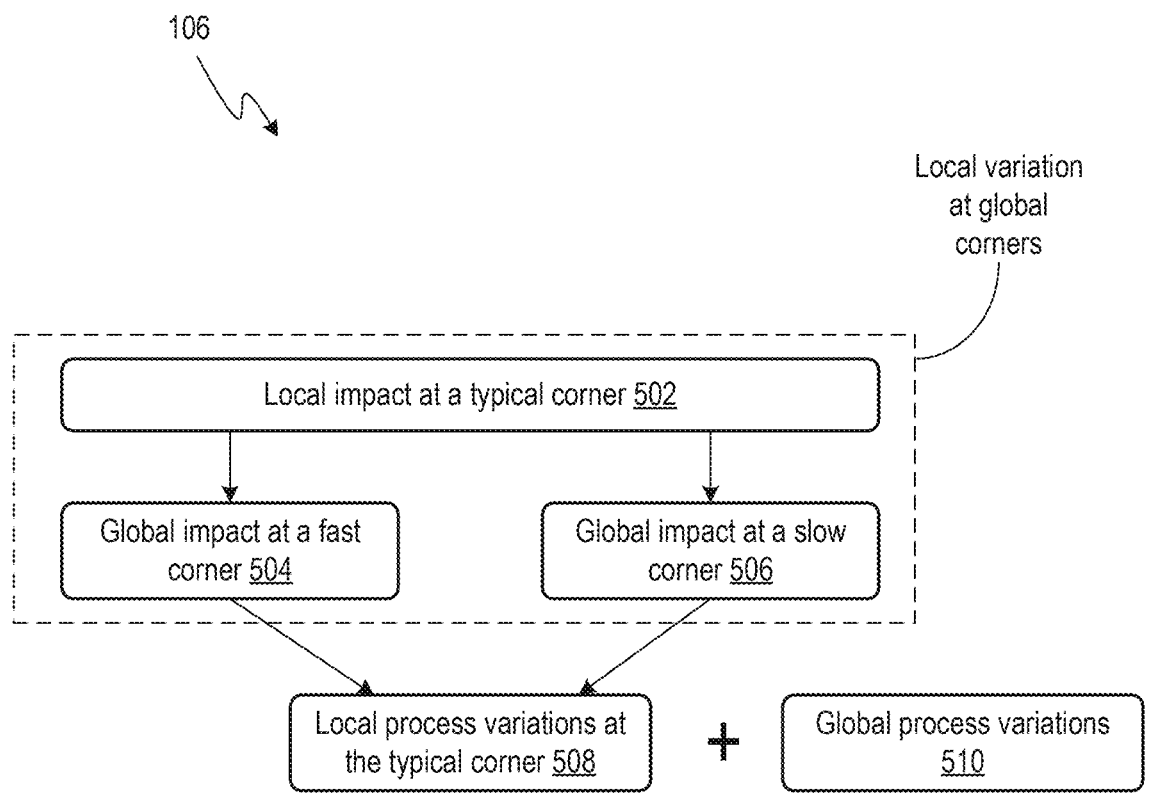
FIG. 5 illustrates a process for combining global and local process variation based on scaling or prediction in accordance with some embodiments described herein.

FIG. 5 illustrates a process for combining global and local process variation based on scaling or prediction in accordance with some embodiments described herein. The process illustrated in FIG. 5 may correspond to step 106 in FIG. 1.

In embodiments where only a TT library is available, a process based on scaling or prediction may be used to determine the combined distribution. A global process variation distribution (e.g., distribution of metric 410) may be computed using the process illustrated in FIG. 4A. During MC analysis, the local distribution may be sampled to obtain a local variation amount. The local distribution may be the POCV distribution implemented by an STA system (e.g., a set of instructions executing on a processor to perform STA).

The local variation amount may be scaled based on the relative location of the global variation amount being used in the MC analysis (the global variation amount may be sampled based on the distribution of metric 410). The scaled local variation amount may then be added to the global variation amount to obtain the combined variation amount.

Specifically, in some embodiments described herein, the global impact at a fast corner 504, the global impact at a slow corner 506, and the local impact at a typical corner 502 may be used to compute values $G_{fast}/L$ and $G_{slow}/L$, where $G_{fast,slow}$ is the global delay impact evaluated using $\Delta \vec{P}_{fast,slow}$, and the metric sensitivity model, and L is the local nominal delay impact at the typical corner. During MC sampling of local process variations at the typical corner, the value $G_{fast}/L$ may be used to scale early side delay sampling, and the value $G_{slow}/L$ may be used to scale late side delay sampling, then the two scaled values may be merged to obtain a local delay impact (e.g., local process variation at the typical corner 508), which may be added to the global delay impact (e.g., global process variation 510) to generate the combined variation distribution.

Figure 6:
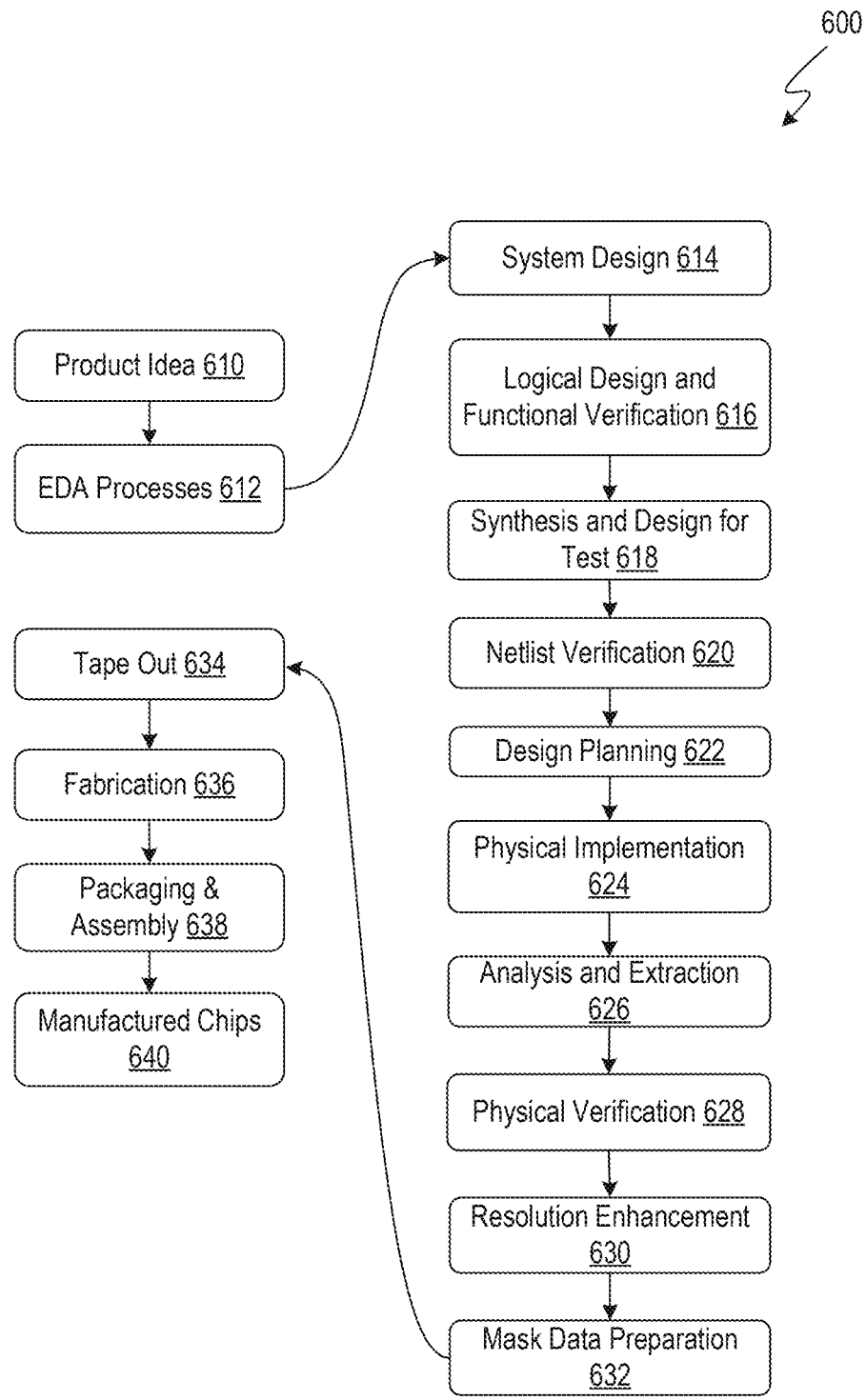
FIG. 6 illustrates an example set of processes used during the design, verification, and fabrication of an article of manufacture such as an integrated circuit to transform and verify design data and instructions that represent the integrated circuit.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The processes described by be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
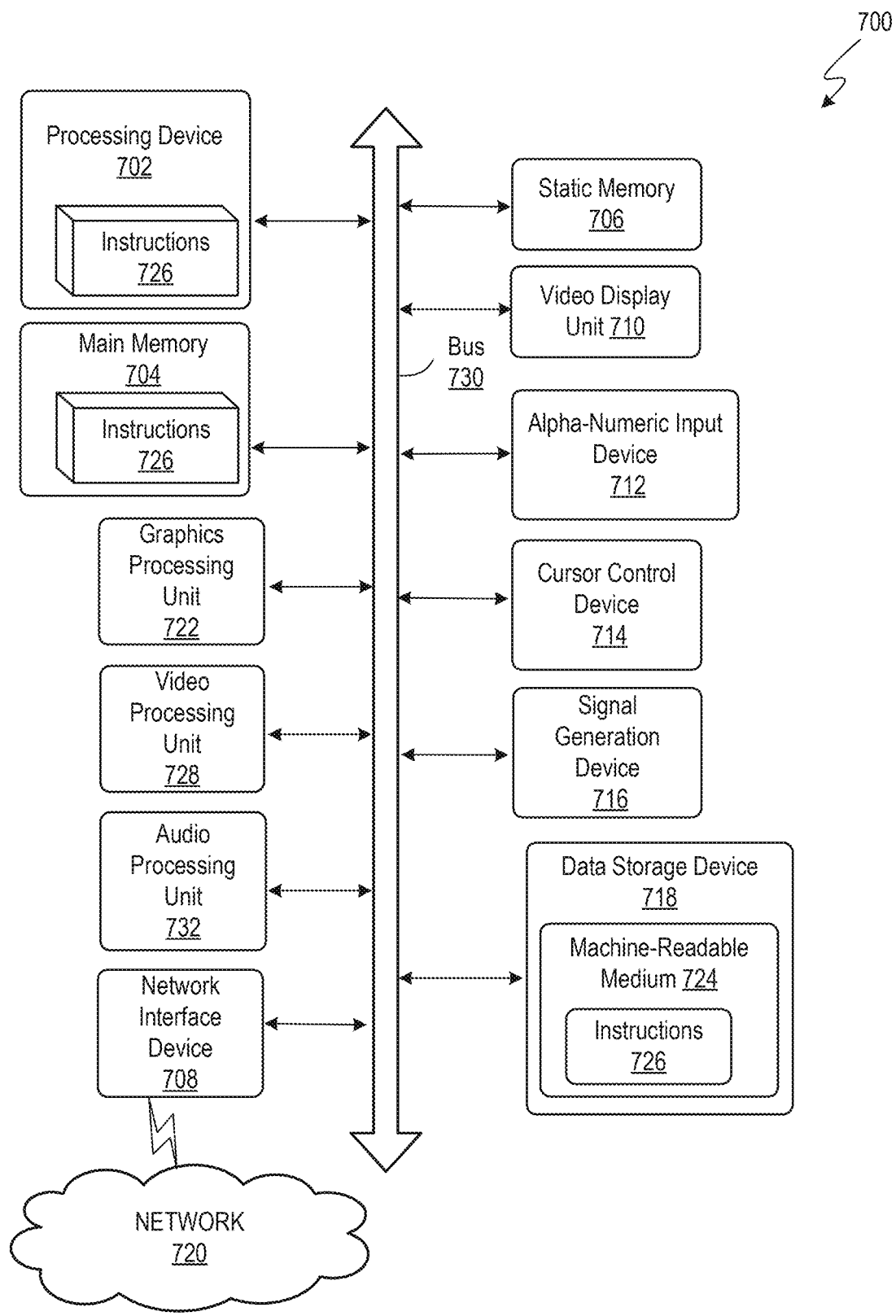
FIG. 7 illustrates an example machine of a computer system within which a set of instructions, for causing the machine to perform any one or more of the methodologies discussed herein, may be executed.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   modeling a set of global parameters using a set of equivalent parameters, wherein the set of global parameters represents global process variation in a circuit;
   determining a global distribution for a metric in the circuit by performing Monte Carlo (MC) analysis using the set of equivalent parameters; and
   calculating, by a processor, combined local and global variations for the metric based on the global distribution for the metric and a local distribution for the metric.

2. The method of claim 1, wherein the modeling the set of global parameters using the set of equivalent parameters comprises:
   determining a set of representative circuits;
   determining a set of global process corners corresponding to the metric in the set of representative circuits by performing MC analysis using the set of global parameters, wherein the metric has a first set of values at the set of global process corners; and
   determining a set of value changes for the set of equivalent parameters which generate a second set of values of the metric at the set of global process corners which are substantially equal to the first set of values of the metric.

3. The method of claim 1, wherein the set of equivalent parameters includes one parameter per device type and two parameters per interconnect layer.

4. The method of claim 3, wherein the one parameter per device type is a threshold voltage.

5. The method of claim 3, wherein the two parameters per interconnect layer are either (1) a resistance per unit length and a capacitance per unit length, or (2) a resistance scaling factor and a capacitance scaling factor.

6. The method of claim 1, wherein the calculating the combined local and global variations for the metric based on the global distribution for the metric and a local distribution for the metric comprises calculating a linear combination of the global distribution for the metric and the local distribution for the metric.

7. The method of claim 1, wherein the calculating the combined local and global variations for the metric based on the global distribution for the metric and a local distribution for the metric comprises calculating a root sum squared combination of the global distribution for the metric and the local distribution for the metric.

8. The method of claim 1, wherein the calculating the combined local and global variations for the metric based on the global distribution for the metric and a local distribution for the metric comprises determining local distribution amounts for the metric at a set of process corners by scaling a nominal local distribution amount for the metric based on global distribution amounts for the metric at the set of process corners.

9. A non-transitory computer-readable medium comprising stored instructions, which when executed by a processor, cause the processor to:
   model a set of global parameters using a set of equivalent parameters, wherein the set of global parameters represents global process variation in a circuit;
   determine a global distribution for a metric in the circuit by performing Monte Carlo (MC) analysis using the set of equivalent parameters; and
   calculate combined local and global variations for the metric based on the global distribution for the metric and a local distribution for the metric.

10. The non-transitory computer-readable medium of claim 9, wherein the modeling the set of global parameters using the set of equivalent parameters comprises:
    determining a set of representative circuits;
    determining a set of global process corners corresponding to the metric in the set of representative circuits by performing MC analysis using the set of global parameters, wherein the metric has a first set of values at the set of global process corners; and
    determining a set of value changes for the set of equivalent parameters which generate a second set of values of the metric at the set of global process corners which are substantially equal to the first set of values of the metric.

11. The non-transitory computer-readable medium of claim 9, wherein the set of equivalent parameters includes one parameter per device type and two parameters per interconnect layer.

12. The non-transitory computer-readable medium of claim 11, wherein the one parameter per device type is a threshold voltage.

13. The non-transitory computer-readable medium of claim 11, wherein the two parameters per interconnect layer are either (1) a resistance per unit length and a capacitance per unit length, or (2) a resistance scaling factor and a capacitance scaling factor.

14. The non-transitory computer-readable medium of claim 9, wherein the calculating the combined local and global variations for the metric based on the global distribution for the metric and a local distribution for the metric comprises calculating a linear combination of the global distribution for the metric and the local distribution for the metric.

15. The non-transitory computer-readable medium of claim 9, wherein the calculating the combined local and global variations for the metric based on the global distribution for the metric and a local distribution for the metric comprises calculating a root sum squared combination of the global distribution for the metric and the local distribution for the metric.

16. The non-transitory computer-readable medium of claim 9, wherein the calculating the combined local and global variations for the metric based on the global distribution for the metric and a local distribution for the metric comprises determining local distribution amounts for the metric at a set of process corners by scaling a nominal local distribution amount for the metric based on global distribution amounts for the metric at the set of process corners.

17. An apparatus, comprising:
a memory storing instructions; and
a processor, coupled with the memory and to execute the instructions, the instructions when executed causing the processor to:
model a set of global parameters using a set of equivalent parameters, wherein the set of global parameters represents global process variation in a circuit, and wherein the set of equivalent parameters includes a threshold voltage parameter for each device type, a resistance per unit length parameter for each interconnect layer, and a capacitance per unit length parameter for each interconnect layer;
determine a global distribution for a metric in the circuit by performing Monte Carlo (MC) analysis using the set of equivalent parameters; and
calculate combined local and global variations for the metric based on the global distribution for the metric and a local distribution for the metric.

18. The apparatus of claim 17, wherein the modeling the set of global parameters using the set of equivalent parameters comprises:
determining a set of representative circuits;
determining a set of global process corners corresponding to the metric in the set of representative circuits by performing MC analysis using the set of global parameters, wherein the metric has a first set of values at the set of global process corners; and
determining a set of value changes for the set of equivalent parameters which generate a second set of values of the metric at the set of global process corners which are substantially equal to the first set of values of the metric.

19. The apparatus of claim 17, wherein the calculating the combined local and global variations for the metric based on the global distribution for the metric and a local distribution for the metric comprises calculating a root sum squared combination of the global distribution for the metric and the local distribution for the metric.

20. The apparatus of claim 17, wherein the calculating the combined local and global variations for the metric based on the global distribution for the metric and a local distribution for the metric comprises determining local distribution amounts for the metric at a set of process corners by scaling a nominal local distribution amount for the metric based on global distribution amounts for the metric at the set of process corners.

* * * * *